United States Patent [19]
Harvey et al.

[11] Patent Number: 5,496,414
[45] Date of Patent: Mar. 5, 1996

[54] STOWABLE AND DEPLOYABLE CONCENTRATOR FOR SOLAR CELLS

[76] Inventors: T. Jeffrey Harvey, 829 Clemens Way, Lompoc, Calif. 93436; P. Alan Jones, 321 Barranca Ave., Santa Barbara, Calif. 93109; Allister F. Fraser, 1120 N. Milpas St., Santa Barbara, Calif. 93103

[21] Appl. No.: 252,998

[22] Filed: Jun. 2, 1994

[51] Int. Cl.$^6$ .................... H01L 31/045; H01L 31/052
[52] U.S. Cl. ..................... 136/245; 136/246; 136/259
[58] Field of Search ................... 136/245, 246, 136/259

[56] References Cited

FOREIGN PATENT DOCUMENTS 61-199671  9/1986  Japan ..................... 136/245
61-202479  9/1986  Japan ..................... 136/245

*Primary Examiner*—Aaron Weisstuch
*Attorney, Agent, or Firm*—Donald D. Mon

[57] ABSTRACT

A stowable and deployable concentrator for solar cells, A flexible, springily resilient Fresnel lens is held in a frame whose relaxed condition holds the Fresnel lens as the linear fragment of a cylinder. When in this deployed shape, the Fresnel lens concentrates energy onto a strip of solar cells, The frame is springily mounted by support means, biased toward the deployed condition, and when the Fresnel lens and frame are pressed toward the cells, they tend to flatten toward a stowed condition.

8 Claims, 3 Drawing Sheets

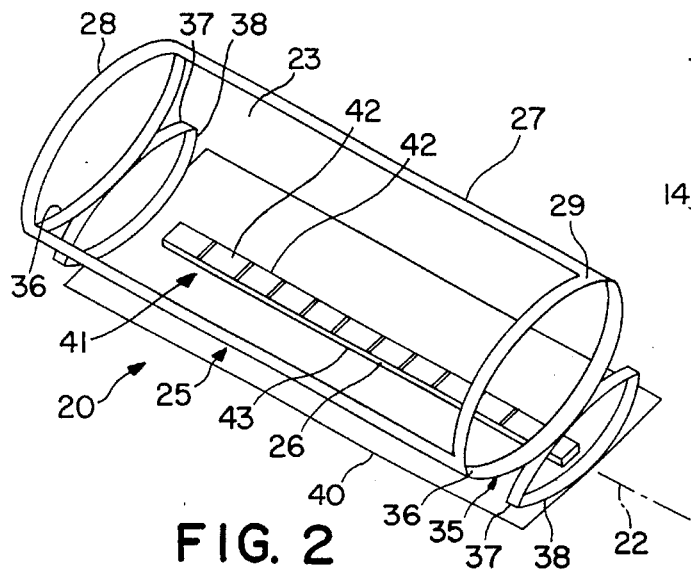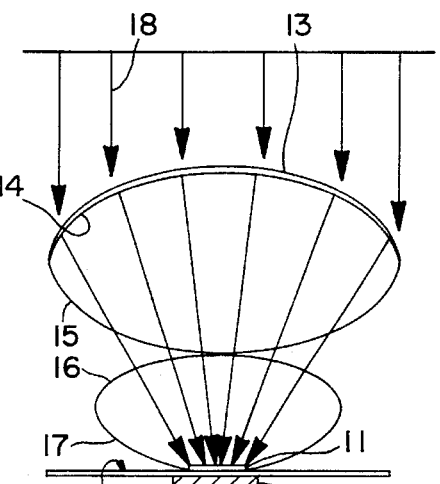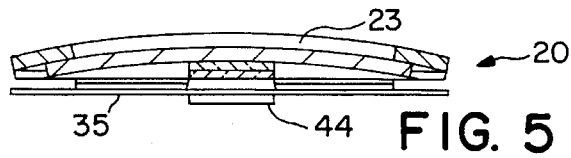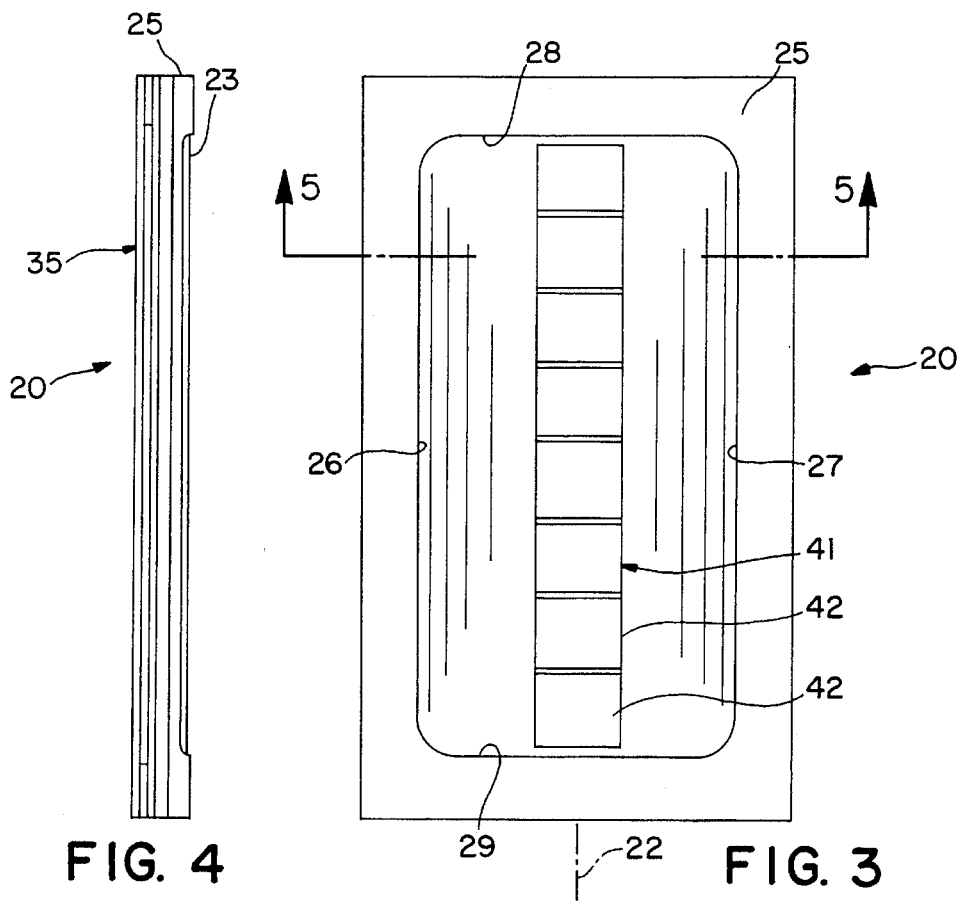

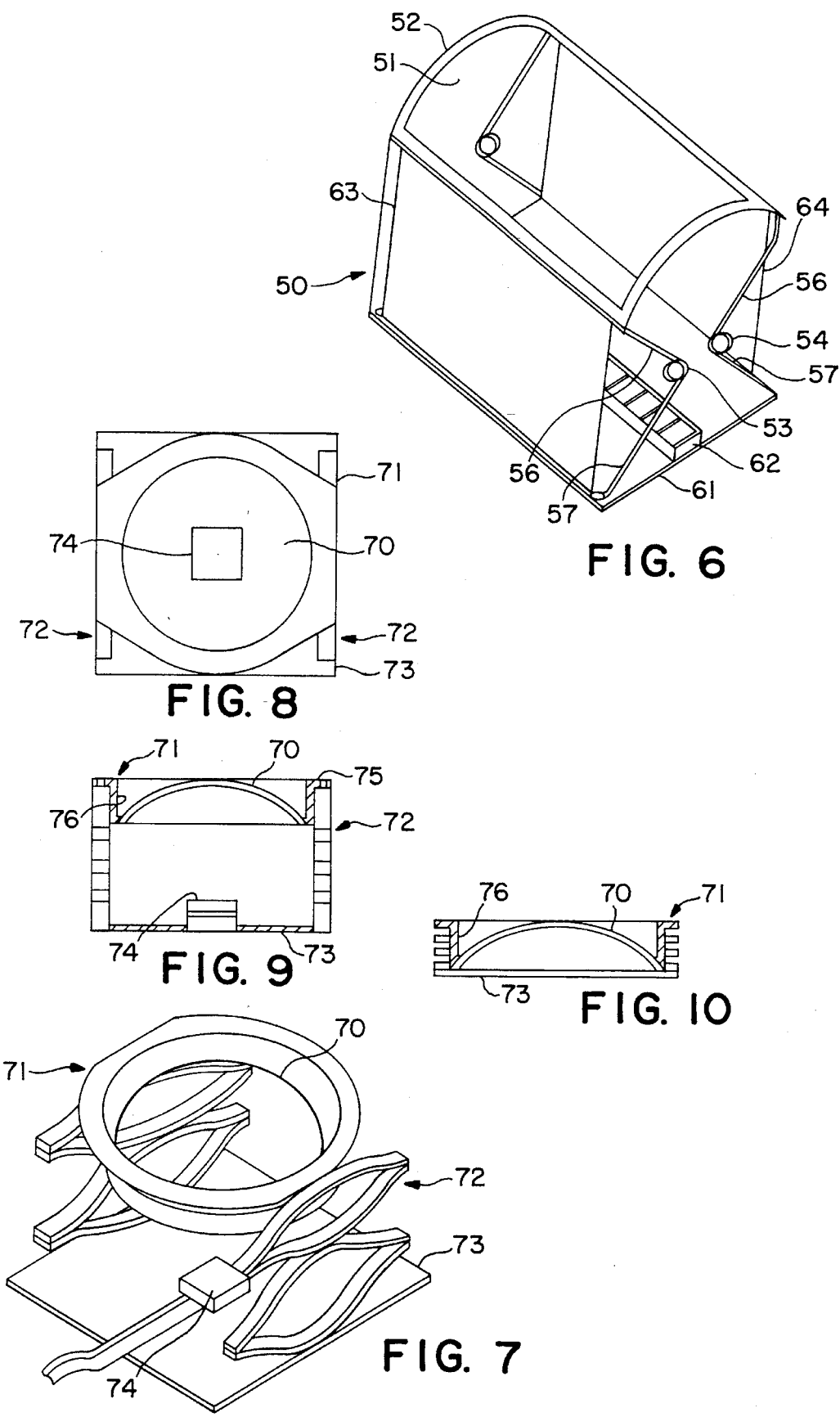

5,496,414

STOWABLE AND DEPLOYABLE CONCENTRATOR FOR SOLAR CELLS

FIELD OF THE INVENTION

A concentrator for solar energy which focuses incident energy on a lesser cell area, which can be stowed in a lesser volume than its deployed volume, and which can readily be deployed to its deployed operative configuration from a stowed configuration.

BACKGROUND OF THE INVENTION

Solar cells which convert radiant energy from the sun into electrical energy are used to power spacecraft such as satellites. Designers of power systems for this application face numerous design constraints, of which weight is one of the most critical. The extraordinarily high cost of placing a pound of weight into space is a serious constraint, and any improvement which can reduce the weight and still provide adequate performance is actively sought.

Another constraint is the need for shielding the solar cells against radiation in regions of high fluence. An example is found in Van Allen belt radiation at about 7,000 kilometers height, which is where many satellites orbit. It is riot uncommon to apply a shielding layer of sufficient density to an entire craft merely in order to protect some parts of it, such as the solar cells. This significantly increases the weight of the craft. Any arrangement which can reduce the area or volume that must be shielded is also actively sought.

Yet another design constraint faced by the designer is the tendency of a concentrator-cell assembly to move out of proper alignment when bonded to a substrate which has a significantly different thermal coefficient of expansion. Additionally, the mechanical fatigue caused by this movement can degrade the system's lifetime.

Still another constraint is the volume required to pack a solar cell array into the spacecraft for containment while being launched. Reduction of stowed envelope volume is another design objective.

This invention provides an improvement for all of the above design constraints. It requires only a lesser area of cells for the same incident window area, and a configuration stowable in a lesser volume and readily deployable to a larger volume in which its elements are properly arranged. The lesser cell area requires less shielding. The consequence is a significant reduction of weight for the same kilowatt output, and a reduction of weight needed for shielding. A further consequence is that the reduced area of cells can reduce array costs. Also, the cells and their substrate can have a close match of thermal coefficient of expansion so as to eliminate movement of the cells out of alignment when the cells and substrate are heated, as they will be.

BRIEF DESCRIPTION OF THE INVENTION

A stowable and deployable concentrator for solar cells according to this invention includes a Fresnel lens, which may be circular, but which preferably will be linear. The lens may be flat, but preferably will be trough-like when linear and domed when circular. A frame supports the lens, and the frame in turn is supported by deflectable support means which itself is mounted to a substrate. The lens has a transverse window area, a focus, and a focus area at the focus. Solar cells are mounted to the substrate in the focal area. The focal area for a circular lens will be spot-like. The focal area for a linear lens will be linear, generally rectangular.

According to a preferred but optional feature of this invention, the lens is linear, trough-like, and flexible. The frame at the curved ends of the lens is also flexible. The frame and the lens can be flattened when pressed toward the base, thereby optimally to reduce the volume of the concentrator in its stowed condition.

According to yet another preferred but optional feature of the invention, the support means and the portions of the frame at the curved ends of the lens are formed as bent leaf springs which tend to return to their deployed condition.

According to yet another preferred but optional feature of the invention, the substrate is foldable so as to compress the concentrators to their stowed configuration when folded together.

The above and other features of this invention will be fully understood from the following detailed description and the accompanying drawings, in which:

BRIEF DESCRIPTION OF THE DRAWINGS

FIG. 1 is an end view of a schematic showing of the invention;

FIG. 2 is a perspective view of the presently-preferred embodiment of the invention;

FIG. 3 is a top view of FIG. 2, showing the device in its stowed condition;

FIG. 4 is a left hand side view of FIG.3;

FIG. 5 is a cross-section taken at line 5—5 in FIG. 3;

FIG. 6 is a perspective view of another embodiment of the invention;

FIG. 7 is a perspective view of yet another embodiment of the invention;

FIG. 8 is a top view of FIG. 7;

FIG. 9 is an end view of FIG. 8 showing the device in its deployed condition;

FIG. 10 is a view similar to FIG. 9 sectioned at the center line, showing the device in its stowed condition;

DETAILED DESCRIPTION OF THE INVENTION

Figures 11, 12, 13:
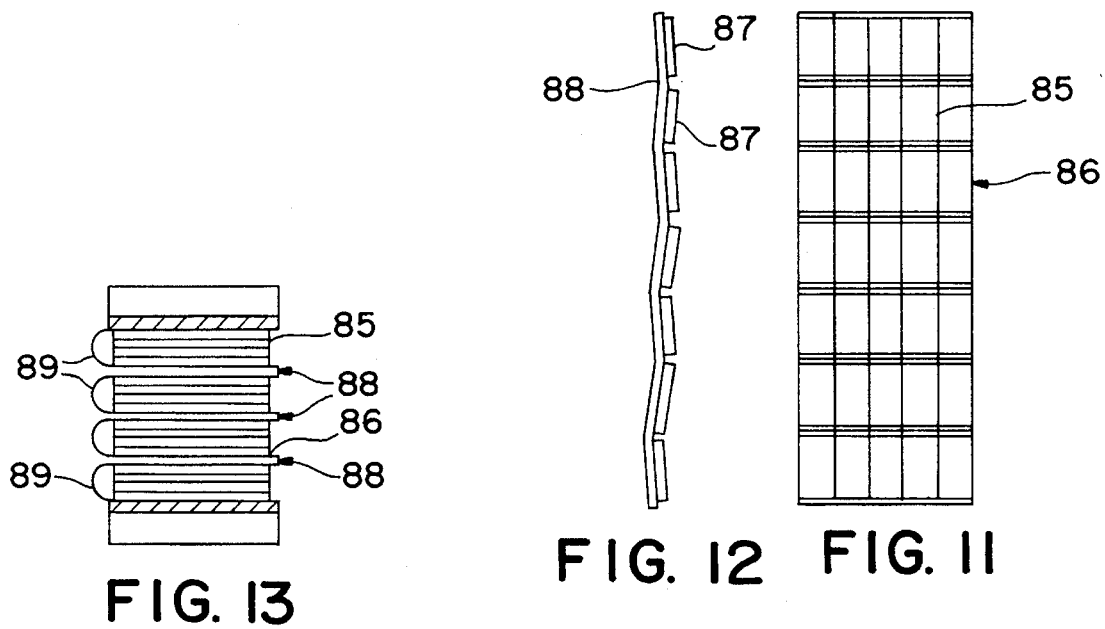
FIG. 11 is a plan view of a set of devices mounted to an accordion foldable flexible substrate.
FIG. 12 is a left hand side view of FIG. 11.
FIG. 13 is a side view of the embodiment of FIG. 11 in its stowed condition.

A photovoltaic module using a trough-like linear Fresnel lens and an in-line array of solar cells is known. No claim is made to this feature of the invention, per se. Its characterizing feature is a curved trough like lens bearing Fresnel facets. As a consequence, incident energy is deflected toward a focus of lesser area, where the cells are placed. The lens is held by rigid members in its correct location and configuration relative to the cell array. This lens, which can be obtained from Entech, Inc., of Dallas, Tex. , is directly useful in this instant invention.

In addition to linear lenses, conventional circular Fresnel lenses can be utilized, but these suffer from the fact that they focus to a spot, and cannot enjoy the benefit of the elongated linear lens and its linear, extended focal area. Linear lenses are to be preferred.

The gist of this invention is schematically shown in FIG. 1. A substrate 10 bears a sequence of solar cells 11, and beneath the cells a radiation shield 12. A flexible trough-like Fresnel lens 13 is supported in its curved deployed condition by a frame 14 and three leaf springs 15,16,17. The leaf springs are joined at their ends. Leaf spring 15 is joined to the frame. Springs 15 and 16 are joined at their mid points, and spring 17 is joined to the substrate. The springs and frame are shown in their relaxed conditions, where they properly support the lens relative to the frame, and to relative to incident solar radiation 18. When it is to be stowed, the device is flattened (or nearly flattened) by applying a surface to it which is parallel to the substrate and forcing it toward the substrate. As will later be seen, the frame and springs are deflected to approach the substrate. When the flattening force is removed, the device will springly return to its illustrated deployed condition.

The presently-preferred embodiment of a concentrator 20 according to this invention is shown in FIGS. 2–5. The deployed condition is shown in FIG. 2. The stowed condition is shown in FIGS. 3–5. The concentrator has a linear axis 22.

A linear Fresnel lens 23 is formed as an inverted trough, extending axially. The lens is transparent to the wavelengths of interest. It bears characteristic Fresnel facets, extending axially on its inner surface. The curvature of the outer surface, and of the surface bearing the facets are designed such that the angles at which the light enters and exits the lens are equal. This produces a condition that maximizes optical efficiency while minimizing the effect of radial shape errors. An optical system which reduces the focused area to about 1/21 of the lateral array of the window of the lens is readily attained. The details of the optical elements and their relative locations are not of importance to this invention. These can be calculated by any suitably skilled designer in the art. Instead, this invention relates to the support of this system and enablement of its stowage.

The advantages of this invention are best attained by providing the lens as a flexible member whose curvature in deployment can be reduced or eliminated (flattened) in the stowed condition. However, the use of rigid lenses, or of lenses that can only partially be flattened, is within the scope of this invention.

In FIG. 2, the lens is flexible, and is rectangular when flattened. It is supported and bounded by a frame 25 which has two sides 26,27 and two ends 28,29. Ends 28 and 29 are springly flexible. Their undistorted shape at rest is the curved shape shown in FIG. 2 and is the shape utilized in the deployed condition. Ends 28 and 29 thereby determine the curvature of the deployed lens.

Sides 26 and 27 may also be springly flexible, but they are intended to remain flat and parallel to the linear axis 22 under all conditions. The edges of the lens are attached variously to the sides and ends of the frame and will rotate about their long axis which is parallel to linear axis 22. This rotation allows the lens 23 to assume its proper arc shape. Accordingly, the lens can be deployed in its trough-like configuration, or stowed in a flatter or flattened condition as shown in FIGS. 3–5.

Support means 35 is shown for supporting the frame. As shown in FIG. 1, this means is a group of leaf springs 36,37,38. A similar construction is provided at both ends of the lens. These leaf springs in their undistorted condition are formed as shown in FIGS. 1 and 2, and tend to return to that condition when released from compression.

The ends of leaf springs 36 are fixed to the ends 28 and 29 of the frame. The ends of leaf springs 37 and 38 are joined to each other. The midpoints of leaf springs 36 and 37 are joined to each other. The midpoint of leaf spring 38 is fixed to a substrate 40.

As best shown in FIGS. 1 and 3, a linear strip 41 of solar cells 42 is mounted to the substrate, extending along the focal area 43 of the lens. A sheet 44 of shielding material (FIG. 5), such as copper, shields the cells from the bottom, being attached to the substrate. This is all the shielding for the cell bottoms. The cell fronts are shielded traditionally with cover slide material.

The compressibility of the module is shown in FIG. 3. A flat element (not shown), or an element whose face has the reverse shape of the lens when compressed, is brought against the lens, which flattens the lens, and compresses support means 35 in opposition to the inherent bias of the springs. The module will remain in the stowed condition until the compressive force is released. Then it inherently returns to the illustrated deployed condition.

In FIGS. 2–5 the inherent shape-memory of the support means is relied on to position the frame and the lens correctly. The lens is relatively forgiving, enabling an angular misalignment around the central axis of as much as one degree.

FIG. 6 shows a variation 50 of the design in which an identical Fresnel lens 51 and frame 52 are mounted to a pair of wound coil springs 53,54 each with two arms 56,57. The coils bias the arms apart, and tend to raise the frame relative to substrate 61. A solar cell array 62 is placed on the substrate in the focal area of the lens.

A pair of flexible restraints 63,64 are connected to respective sides of the frame and to the substrate. They are flexible but inelastic. The springs can open only as far as the restraints permit, and thereby the restraints establish the location of the sides of the lens above the substrate.

Despite the many advantages of a linear Fresnel lens, there may be applications where a circular lens will be found to be preferable. Circular lenses (and also linear lenses) can be flat, but generally a curved lens will be preferred. While linear lenses readily deform toward a plane, circular domed lenses, are best left as domes. However, a springly flexible domed lens, which can be deformed to a lesser height, is within the scope of this invention.

A domed Fresnel lens 70 is shown in use in FIGS. 7–10. As in the previous embodiments, it is held in a frame 71 mounted to support means 72 identical to those in FIGS. 2–5. A substrate 73 mounts the support means, and also a solar cell 74 or cell array, within the focal area of the lens.

Frame 71 has a rim 75 and a downwardly depending shroud ring 76 to which the edge of the lens is attached. The shroud is deep enough to house the lens.

FIGS. 7–9 show the deployed condition. FIG. 10 shows the stowed condition, where a compressive force on the rim has pressed the frame and the support means flat against the 14 substrate. In FIG. 10, notice that the support means does not impede the contact of the frame with the substrate.

This invention is especially attractive for use in folded panel arrays such as accordion-type folded arrays. When their module-bearing faces are brought to their folded positions, oppositely facing modules can flatten each other, thereby substantially decreasing the volume of the array in its stowed condition, because the lesser stowed height enables the panel faces to approach each other more closely than if the modules had to retain their full operational height.

For example, FIGS. 11–13 show a module-bearing face 85 of an accordion-foldable panel array 86. Examples of modules 87 are shown on opposite sides of fold lines 88. When the array is folded, the modules will face each other, and flatten each other to the extent required by the dimensions of the array. They will return to their deployed condition when the array is unfolded.

Notice in FIG. 13 that the spacing between modules must be sufficient to provide for a self-hinge 89 between the rows of cells. This arrangement pertains when the substrate itself is flexible.

Figures 14, 15, 16:
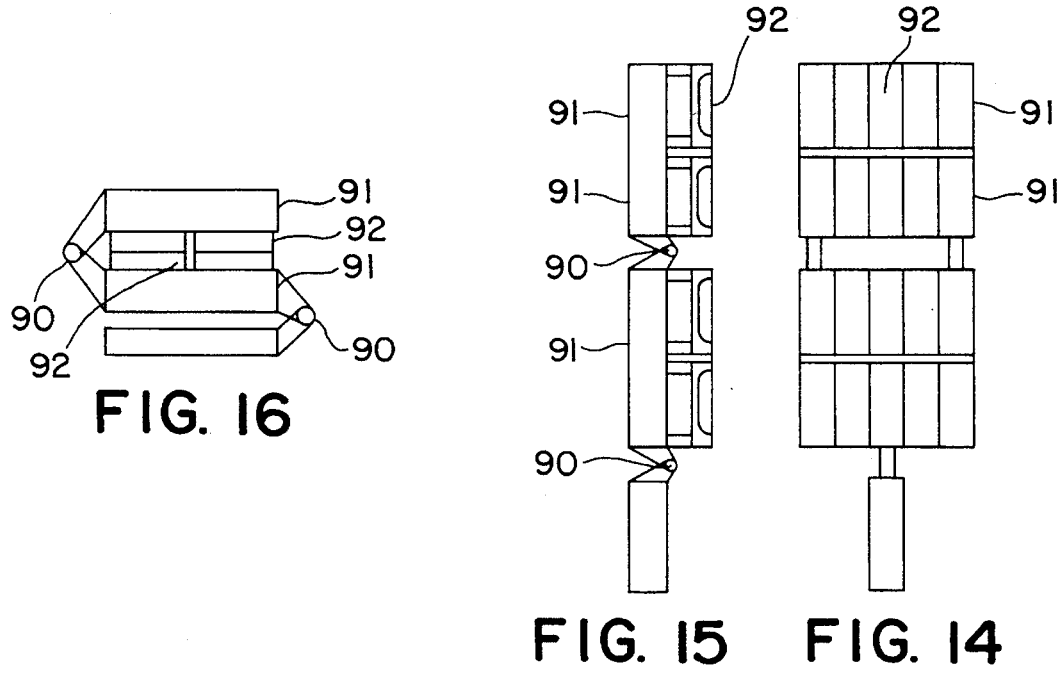
FIG. 14 is a plan view of a set of devices mounted to a rigid, hinged foldable substrate.
FIG. 15 is a left hand side view of FIG. 14.
FIG. 16 is a fragmentary side view of the embodiment of FIG. 14 in its stowed condition.

Should the substrate be rigid, then as shown in FIGS. 14–16, hinges 90 will join adjacent substrates 91, so that cells 92 will properly abut each other in the stowed condition as shown in FIG. 16.

Because the cells will be bonded to the substrate, too great a difference between their thermal coefficients of expansion will cause curling of the substrate and tend to move the cells out of angular alignment with the incident rays on it. This can significantly reduce the efficiency of the cells. Accordingly, the substrate should be selected so that its thermal coefficient of expansion suitably approaches that of the cells. Also, it is an advantage to provide a substrate which is not subject to degradation by radiation apt to be encountered, and which therefore does not require shielding.

A suitable substrate for this purpose is shown in U.S. Pat. No. 5,298,085, issued to Harvey and Jones on Mar. 29, 1994. This patent is incorporated herein by reference in its entirety for its showing of a substrate that can be used in all embodiments of this invention.

As to the cells, silicon cells are useful, but GaAs/Ge cells, or tandem GaAs/GaSh cells have shown greater adaptability to incorporation into a line-focus array as required by this invention. All of these have a sufficiently close match of thermal coefficient of expansion with the substrate disclosed in said U.S. Pat. No. 5,298,085.

This invention thereby enables a very substantial reduction in weight of support structure and shielding required for conventional modules. In fact it can be on the order of 50%, a very important advantage to the spacecraft designer.

This invention is not to be limited by the embodiments shown in the drawings and described in the description, which are given by way of example and not of limitation, but only in accordance with the scope of the appended claims.

We claim:

1. A stowable and deployable concentrator for solar cells, comprising:

a substrate, at least one Fresnel lens, said lens being flexible and having two parallel sides and two parallel ends;

a frame holding said lens, at both sides and both ends, said frame where it holds said ends being springily deflectable, tending to hold the lens in a trough-like shape when in deployed condition, and reducing said curvature as its own curvature is reduced to move the lens closer to the substrate and to a stowed condition;

at least one solar cell mounted to said substrate in the focal area of said lens; and deflectable support means mounted to said substrate and connected to said frame, said support means being resilient and inherently biased such as to exert a force in opposition between the substrate and the frame to tend to move the frame and the lens away from the substrate to said deployed condition, and to be deflectable by a force exerted on said frame to overcome said bias and move said frame and said lens closer to said substrate in said stowed condition.

2. A concentrator according to claim 1 in which said deflectable support means includes a plurality of leaf springs, two of said leaf springs being joined at their ends, the mid-point of one being fixed to said substrate, one having its ends attached to the frame at the sides of said lens, and two being joined at their mid-points.

3. A concentrator according to claim 1 in which said deflectable support means comprises a pair of springs which include a central coil and a pair of arms biased apart by said coil, said arms being attached to said frame to bias it away from said substrate, and restraint means connected to said frame and to said substrate to limit the separation of the lens from the substrate.

4. A concentrator according to claim 1 in which the thermal coefficient of expansion of the at least one solar cell and of the substrate are sufficiently close to one another that curvature of the substrate relative to the at least one solar cell when they are both heated is insignificant.

5. A concentrator according to claim 1 in which said substrate is inherently foldable in an accordion-like patter, a plurality of said lenses and support means being mounted to said substrate so as to abut each other when the substrate is folded.

6. A concentrator according to claim 1 in which said substrate comprises a plurality of rigid elements to which a plurality of said solar cells and lenses are mounted, and in which hinges join adjacent ones of said elements, so that some of the said lenses abut one another when the substrate is folded.

7. A stowable and deployable concentrator for solar cells, comprising;

at least one flexible circular Fresnel lens, at least one said lens being domed;

a rigid frame supporting each of said at least one lens;

a substrate;

a solar cell mounted to said substrate in the focal area of each of said at least one lens; and deflectable support means mounted to said substrate and connected to said frame, said support means being resilient and inherently biased such as to exert a force in opposition between the substrate and the frame to tend to move the frame and the lens away from the substrate to a deployed condition, and to be deflectable by a force exerted on said frame to overcome said bias and move said frame and said lens closer to said substrate in a stowed condition.

8. A concentrator according to claim 7 in which said frame includes a shroud which surrounds said lens and extends axially above it.

* * * * *